United States Patent
Martin et al.

(10) Patent No.: US 6,949,330 B2
(45) Date of Patent: Sep. 27, 2005

(54) MULTIPLE LEVEL PHOTOLITHOGRAPHY

(75) Inventors: Brian Martin, Plymouth (GB); John Perring, Plymouth (GB); John Shannon, Plymouth (GB)

(73) Assignee: Zarlink Semiconductor Limited, Swindon (GB)

( * ) Notice: Subject to any disclaimer, the term of this patent is extended or adjusted under 35 U.S.C. 154(b) by 93 days.

(21) Appl. No.: 10/231,918

(22) Filed: Aug. 30, 2002

(65) Prior Publication Data

US 2003/0044734 A1 Mar. 6, 2003

(30) Foreign Application Priority Data

Sep. 1, 2001 (GB) .............................................. 0121217

(51) Int. Cl.$^7$ ................................................ G03F 7/20
(52) U.S. Cl. ...................... 430/394; 430/396; 430/311
(58) Field of Search ................................ 430/311, 322, 430/394, 396

(56) References Cited

U.S. PATENT DOCUMENTS

| | | | | |
|---|---|---|---|---|
| 4,210,465 A | 7/1980 | Brower | ....................... | 148/1.5 |
| 4,690,728 A | 9/1987 | Tsang et al. | ................. | 156/643 |
| 4,829,024 A | 5/1989 | Klein et al. | .................. | 437/189 |
| 5,134,058 A | 7/1992 | Han | ........................... | 430/327 |
| 5,310,457 A | 5/1994 | Ziger | ......................... | 156/657 |
| 5,612,956 A | 3/1997 | Walker et al. | .............. | 370/545 |
| 5,702,868 A | 12/1997 | Kellam et al. | .............. | 430/312 |
| 5,790,552 A | 8/1998 | Proctor et al. | ............. | 370/466 |
| 6,171,405 B1 | 1/2001 | Lee | ................. | 134/3 |
| 6,251,564 B1 | 6/2001 | Lin et al. | ..................... | 430/311 |
| 2003/0022112 A1 * | 1/2003 | Arifin et al. | ................. | 430/394 |

FOREIGN PATENT DOCUMENTS

| | | |
|---|---|---|
| EP | 0468818 A2 | 7/1991 |
| EP | 0618709 A2 | 2/1994 |
| EP | 0 601 887 | 6/1994 |
| EP | 0705000 A2 | 9/1995 |
| EP | 0618709 A3 | 3/1998 |
| EP | 0705000 A3 | 5/1998 |
| EP | 1122916 A2 | 1/2001 |
| GB | 2270820 A | 3/1994 |
| GB | 0121217.4 | 9/2001 |
| GB | 0122221.5 | 9/2001 |
| GB | 0125612.2 | 10/2001 |
| GB | 0126246.8 | 11/2001 |
| JP | 02-280439 A | 11/1990 |
| JP | 09 055746 A | 2/1997 |
| WO | WO 90/07832 A1 | 7/1990 |

OTHER PUBLICATIONS

EP Search Report, EP Application No. EP02102074, dated Jul. 24, 2003.

S.M. Sze, VLSI Technology, McGraw–Hill Book Company, New York (1983), pp. 267–268, 303–304.

* cited by examiner

*Primary Examiner*—Kathleen Duda
(74) *Attorney, Agent, or Firm*—Moser, Patterson & Sheridan, LLP

(57) ABSTRACT

A method is provided for performing photolithography on a substrate which has a first region on a lower level and a second region on an upper level, wherein a first pattern area exists within said first region, a second pattern area exists within said second region, and at least said first and second regions are coated with a photoresist, the method comprising:

Figure 1:
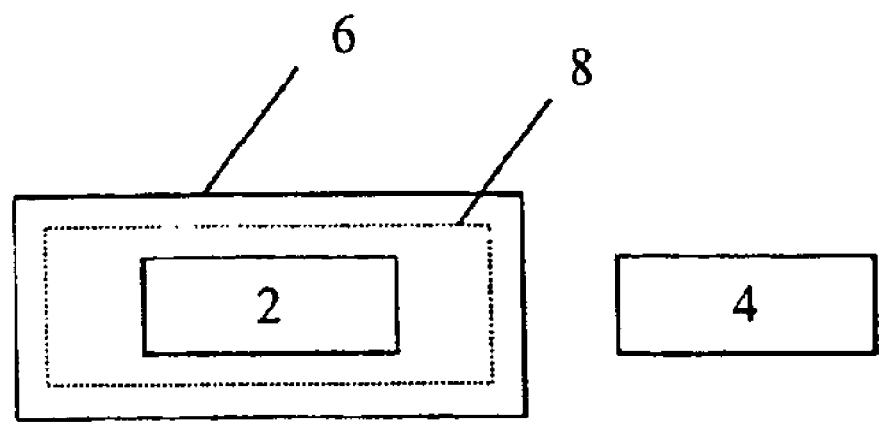

a) exposing the photoresist through a first mask so as to expose said first region including said first pattern area, and thus create a first pattern in said first pattern area, but not expose said second pattern area; and b) exposing the photoresist through a second mask so as to expose said second pattern area, and thus create a second pattern in said second pattern area, but not expose said first pattern area, and also to expose an area of said first region which lies adjacent said second region.

9 Claims, 1 Drawing Sheet

MULTIPLE LEVEL PHOTOLITHOGRAPHY

The invention relates to photolithography on a substrate having more than one level.

By way of background explanation, in photolithography techniques features are printed by passing light through a "reticle", which acts as a mask and is typically formed from glass printed with chrome patterns. In order to print lines the reticle is provided with slits which allow the light to pass through onto the photoresist (a photosensitive layer used to coat silicon in photolithography techniques).

It may be necessary to define patterns on two different levels of circuit topography, in microelectronics or MEMS (micro electrical mechanical systems) circuits, by optical lithography in cases where upper and lower resist images have to be equal in linewidth and resist profile. The lower resist image may be formed in a recessed area of the wafer.

Some lithography applications in microelectronic or MEMS circuits require patterns, whose linewidth and resist shapes have to be closely matched to ensure correct circuit operation, to be defined on different circuit levels as defined by underlying processing. The cross-sectional contour of such a part-processed wafer, usually Silicon but the technique described here can be applied to any substrate, is often described as circuit topography.

The difficulty of processing such demanding requirements accurately is that the defining optical system, usually a monochromatic reduction lens at 436 or 365 nm wavelength, has a depth-of-focus (DOF) of about 2 micron in which linewidth and profile of the developed resist image can be controlled. Therefore when circuit topography is of the same order as the DOF or greater, resist patterns cannot be adequately controlled resulting in inaccurate linewidths in the etched patterns. Indeed, both linewidth and shape of the resist image contribute towards the etched linewidth. Additionally, the resist may be coated thicker over the lower patterns, which can be placed in a recess, thus leading to difficulties in completely clearing the developed resist within the patterned area and at the edges of the recess. Typical linewidth in the applications tested was between 1 and 2 micron.

Preliminary tests are briefly described here in order to illustrate difficulties and thus confirm why simpler techniques are unsuitable. The difference between upper and lower patterning levels here is 2 micron.

i). The first approach was to use a thick resist of the order of 4 micron. In general, the resist planarises over circuit topography so a thick resist is better suited to defining patterns on two circuit levels with a single exposure. Inspection by electron microscopy (SEM) showed that when patterns on the upper level were clearly developed and correctly exposed, the lower patterns exhibited resist scumming. Increasing develop time had no effect on residues.

ii). We also tried using an alternative resist which has better conformality over circuit topography so that the difference between coated resist thickness over each set of patterns is reduced. The characteristics of coating over a step are that the resist will be thicker at the edges of the recess in which the lower patterns are sited. In this case, when upper patterns were exposed to size, the lower patterns in their recess exhibited residues only around the edges of the recess.

iii). The next approach to obtaining clear development in the lower patterns with the same resist was to use a double puddle develop process. Puddle development is known and entails covering a wafer with developer and allowing it to be static for times of about 45 seconds until the developer is depleted. In double puddle development, which can have advantages in thick resist applications, a second charge of developer is applied after spinning off the first. In this test some undeveloped resist was still visible in the lower patterns but the double develop technique was maintained in subsequent tests.

iv). The limitations of the preliminary tests above using a resist of good conformality are that:

a) When the upper patterns are correctly defined the lower patterns exhibit scumming even with double develop.

b) The patterns are defined with a single mask and single exposure, so that linewidths cannot be matched.

According to the invention there is provided a method of performing photolithography and a pair of masks for use in such a method, as set out in the accompanying claims.

It will be appreciated that the method results in the edge of any recessed area receiving a double exposure, thus ensuring that the resist is properly cleared in this area.

An embodiment of the invention will now be described, by way of example only, with reference to the accompanying FIGURE, which is a schematic illustration of two patterned areas on a multi-level wafer.

Referring to the FIGURE, a wafer substrate is provided with two pattern areas 2 and 4. Pattern area 2 lies within a recess 6, and is thus at a lower level than pattern area 4.

The substrate is coated with a photoresist, which tends to be thicker at the edges of the recessed area 6, at the bottom of the step between the upper and lower levels.

The photoresist is exposed in two stages. In the first stage, a pattern is created on pattern area 2 (by exposing pattern area 2 through a reticle), while pattern area 4 is masked. This is done using a first mask (not shown). In the second stage, a pattern is created on pattern area 4 (by exposing pattern area 4 through a reticle), while pattern area 2 is masked. This is done using a second mask (not shown).

The second mask is provided with a "patch" which masks pattern area 2. However, although the patch covers pattern area 2, it does not cover the whole of recessed area 6. Dotted line 8 illustrates schematically the area covered by the patch. In fact, the patch only extends about 5 microns beyond the edges of the pattern area 2. The result is that the edge of the recessed area 6, which lies outside of the patched area 8, receives a double exposure, which ensures that the resist is properly cleared in this area.

It should be appreciated that there may be any number of upper and lower pattern areas on the substrate, but only two are shown in the accompanying FIGURE for clarity.

It will thus be seen that the technique described here uses two masks to define the upper and lower layers in separate exposure operations. In this embodiment (which is suitable for manufacturing an infra red detector) there is a need to create identical patterns on upper and lower levels. The masks for this embodiment are identical in all but two important respects. The mask used to define the upper patterns has protective chrome patches over all the lower patterned areas and, likewise, the mask used to define the lower patterns has similar chrome patches over all the upper patterned areas. The size of the chrome patches extends beyond the edges of the patterns which they protect by only 5 micron (at the wafer scale) on each side.

Therefore, when the masks are applied sequentially, upper and lower patterns receive a single exposure but the recess surrounding the lower patterns receives a double exposure thus ensuring complete resist clearance during double development. Other non-patterned circuit areas will harmlessly also receive a double exposure. The exposures and focus settings used for each mask can be different thus ensuring correct linewidths and profiles in the developed resist images.

In this embodiment, wafers were coated with 1.8 micron of the chosen resist and exposed at 365 nm wavelength with the mask pair in turn. No importance is attached to whether upper or lower patterns are defined first. The upper patterns were exposed at 250 mJ and zero focus whereas the lower were exposed at 230 mJ and with a 2.0 micron focus offset. Wafers were then developed using the double puddle process.

This embodiment allows patterns to be defined on different circuit topography where linewidths have to be matched. The pair of masks allow separate exposure and focus conditions and double exposure of the troublesome recess around the lower patterned area where the resist tends to be thicker as it covers topography. Different types of resist can be used, and the double develop process is optional.

What is claimed is:

1. A method of performing photolithography on a substrate which has a first region on a lower level and a second region on an upper level, wherein a first pattern area exists within said first region, a second pattern area exists within said second region, and at least said first and second regions are coated with a photoresist, the method comprising:

a) exposing the photoresist through a first mask so as to expose said first region including said first pattern area, and thus create a first pattern in said first pattern area, but not expose said second pattern area; and b) exposing the photoresist through a second mask so as to expose said second pattern area, and thus create a second pattern in said second pattern area, but not expose said first pattern area, and also to expose an area of said first region which lies adjacent said second region.

2. The method as claimed in claim 1, wherein step (b) is carried out before step (a).

3. The method as claimed in claim 1, wherein said first region is a recessed region which lies within said second region.

4. The method as claimed in claim 3, wherein said area of said first region which is exposed in step (b) is a boundary area which lies around the edges of said first region.

5. The method as claimed in claim 4, wherein said first and second patterns are substantially identical.

6. The method as claimed in claim 4, wherein said boundary area extends along the entire edge of said first region, and exposing said boundary region in step (b) comprising exposing the entire boundary region.

7. The method as claimed in claim 1, wherein said upper and lower levels are separated by approximately 2 microns.

8. The method as claimed in claim 1, wherein in step (a) said first mask covers the whole of said second region.

9. The method as claimed claim 8, wherein said first and second masks are the same mask, provided with patches in different positions.

* * * * *